(12) United States Patent
Jung

(10) Patent No.: US 9,847,344 B2
(45) Date of Patent: Dec. 19, 2017

(54) SEMICONDUCTOR DEVICE

(71) Applicant: SK hynix Inc., Icheon-si, Gyeonggi-do (KR)

(72) Inventor: Sung Wook Jung, Hwaseong-si (KR)

(73) Assignee: SK hynix Inc., Icheon-si Gyeonggi-do (KR)

(*) Notice: Subject to any disclaimer, the term of this patent is extended or adjusted under 35 U.S.C. 154(b) by 0 days.

(21) Appl. No.: 15/056,074

(22) Filed: Feb. 29, 2016

(65) Prior Publication Data
US 2017/0092655 A1 Mar. 30, 2017

(30) Foreign Application Priority Data
Sep. 30, 2015 (KR) .................. 10-2015-0137975

(51) Int. Cl.
*H01L 29/792* (2006.01)
*H01L 27/11582* (2017.01)
*H01L 27/11565* (2017.01)
*H01L 27/1157* (2017.01)

(52) U.S. Cl.
CPC .... *H01L 27/11582* (2013.01); *H01L 27/1157* (2013.01); *H01L 27/11565* (2013.01)

(58) Field of Classification Search
CPC ............................................... H01L 27/11565
See application file for complete search history.

(56) References Cited

U.S. PATENT DOCUMENTS

| | | | | |
|---|---|---|---|---|
| 3,418,641 A | * | 12/1968 | Fyfe | G11C 11/38 333/138 |
| 2006/0001076 A1 | * | 1/2006 | Ozawa | H01L 27/115 257/315 |
| 2007/0252192 A1 | * | 11/2007 | Mokhlesi | H01L 27/115 257/315 |
| 2014/0061766 A1 | * | 3/2014 | Kito | H01L 27/11565 257/324 |

FOREIGN PATENT DOCUMENTS

KR 1020110095697 A 8/2011

* cited by examiner

*Primary Examiner* — Cuong Q Nguyen
*Assistant Examiner* — Nishath Yasmeen
(74) *Attorney, Agent, or Firm* — William Park & Associates Ltd.

(57) ABSTRACT

A semiconductor device may include first conductive patterns and first interlayer insulating layers. Each of the first conductive patterns may include a first pad pattern extending in a first direction and first line patterns extending from the first pad pattern in a second direction crossing the first direction, widths of the first line patterns increasing as a distance from the first pad pattern decreases. The first conductive patterns and the first interlayer insulating layers may be stacked on top of each other.

20 Claims, 14 Drawing Sheets

SEMICONDUCTOR DEVICE

CROSS-REFERENCE TO RELATED APPLICATION

The present application claims a priority under 35 U.S.C. §119(a) to a Korean patent application number 10-2015-0137975 filed on Sep. 30, 2015 in the Korean Intellectual Property Office, the entire disclosure of which is incorporated herein by reference.

BACKGROUND

1. Technical Field

Embodiments of the present disclosure generally relate to a semiconductor device, and more particularly to a semiconductor device having a pad pattern and a line pattern extending from the pad pattern.

2. Related Art

The semiconductor device may include conductive patterns. The conductive patterns each may include a pad pattern to receive a signal from external devices and line patterns extending from the pad pattern and being coupled to memory cells. The pad pattern may be coupled to a contact plug to receive the signal from the external devices.

DETAILED DESCRIPTIONS

Figure 1:
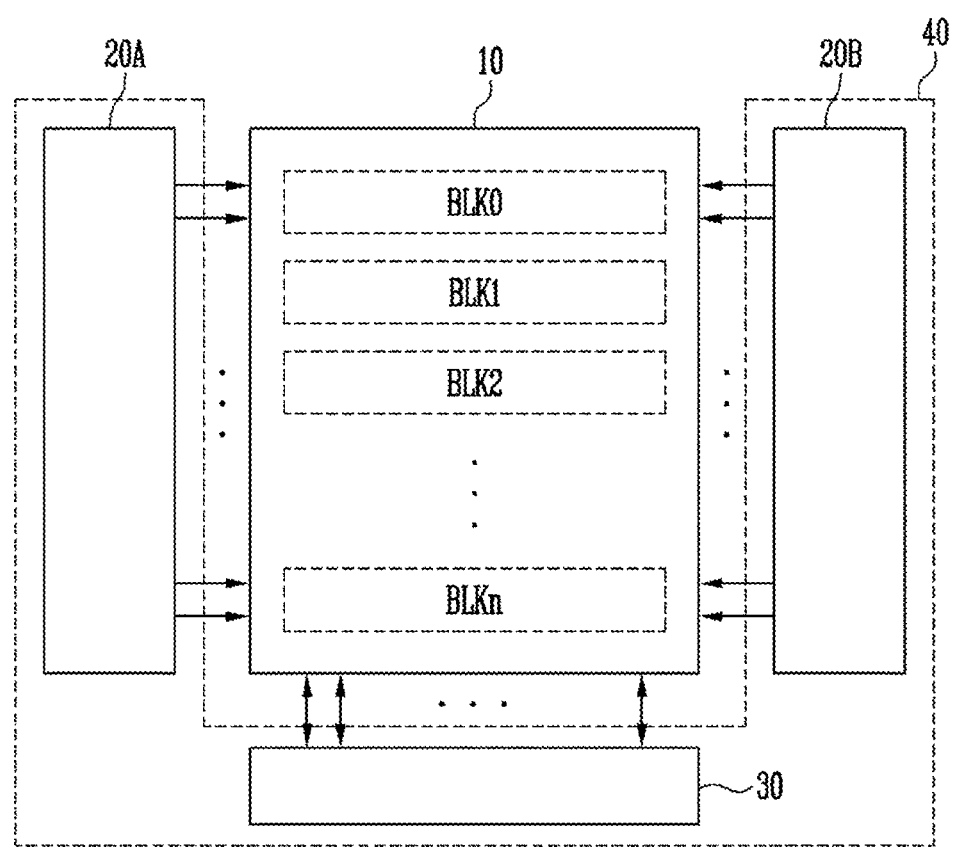
FIG. 1 is a diagram illustrating an example of a semiconductor device according to an embodiment of the present disclosure.

In an embodiment, a semiconductor device may include first conductive patterns and first interlayer insulating layers. Each of the first conductive patterns may include a first pad pattern extending in a first direction and first line patterns extending from the first pad pattern in a second direction crossing the first direction, widths of the first line patterns increasing as a distance from the first pad pattern decreases. The first conductive patterns and the first interlayer insulating layers may be alternately stacked on top of each other.

In an embodiment, a semiconductor device may include a first conductive pad pattern and first conductive line patterns. The first conductive pad pattern may extend in a first direction. The first conductive line patterns may extend from the first pad pattern in a second direction crossing the first direction. Each first line pattern may have a width being increasingly larger toward the first pad pattern.

In an embodiment, a semiconductor device may include a first conductive pad pattern and first conductive line patterns. The first conductive pad pattern may extend in a first direction. The first conductive line patterns may extend from the first pad pattern in a second direction crossing the first direction. Each of the first line patterns may have a first end connected to the first conductive pad pattern and a second end opposite to the first end. Each of the first line patterns may have a tapered shape such that a width of the first end is larger than a width of the second end.

Examples of various embodiments are illustrated in the accompanying drawings and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

Example embodiments will be described in more detail with reference to the accompanying drawings. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, s, operations, elements, and/or components, but do not preclude the presence or addition of one or more other features, integers, s, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, various embodiments of the present disclosure will be described in details with reference to attached drawings.

FIG. 1 is a diagram illustrating an example of a semiconductor device according to an embodiment of the present disclosure.

Referring to FIG. 1, the semiconductor device according to an embodiment of the present disclosure may include a memory cell array 10 and peripheral circuit 40.

The memory cell array 10 may include memory blocks BLK0 to BLKn. The memory blocks BLK0 to BLKn each may include memory cells. The memory cells each may store at least one bit therein. The memory cells may be connected to each other via a channel layer to form a memory string. The memory string may be coupled to a bit line. The memory cells of the memory string may be, respectively, connected to word lines.

The peripheral circuit 40 may include row decoders 20A and 20B and a page buffer 30. The row decoders 20A and 20B may be divided into a first row decoder 20A and a second row decoder 20B, between which the memory cell array 10 is located.

The row decoders 20A and 20B may be coupled to the memory cell array 10 via a pad pattern coupled to the word lines. The row decoders 20A and 20B may select, based on an address, a memory block and a word line coupled to the selected memory block.

The page buffer 30 may be coupled via bit lines to the memory cell array 10. The page buffer 30 may selectively precharge the bit lines. The page buffer 30 may also sense threshold voltages of the memory cells using potentials of the bit lines.

Figure 2A:
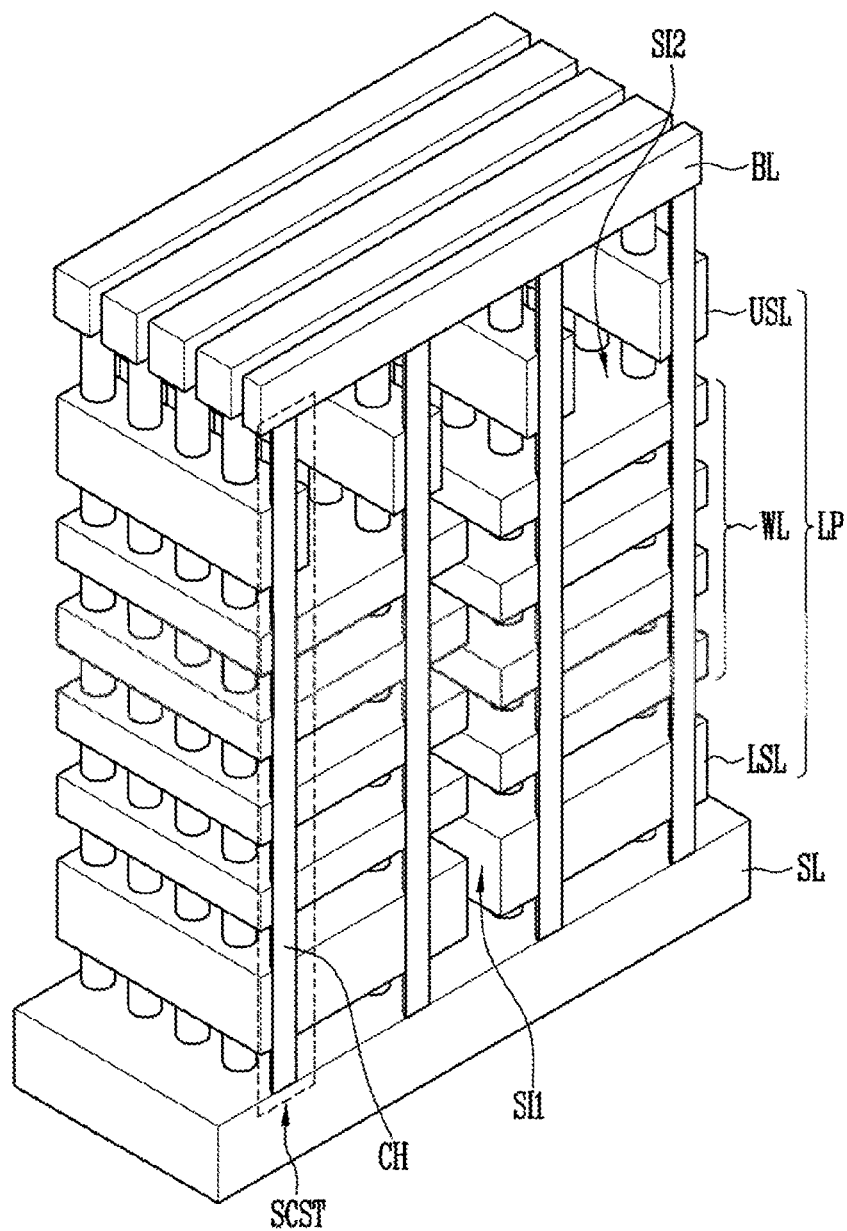
FIG. 2A and FIG. 2B are perspective views illustrating example structures of memory cell arrays according to an embodiment of the present disclosure.
Figure 2B:
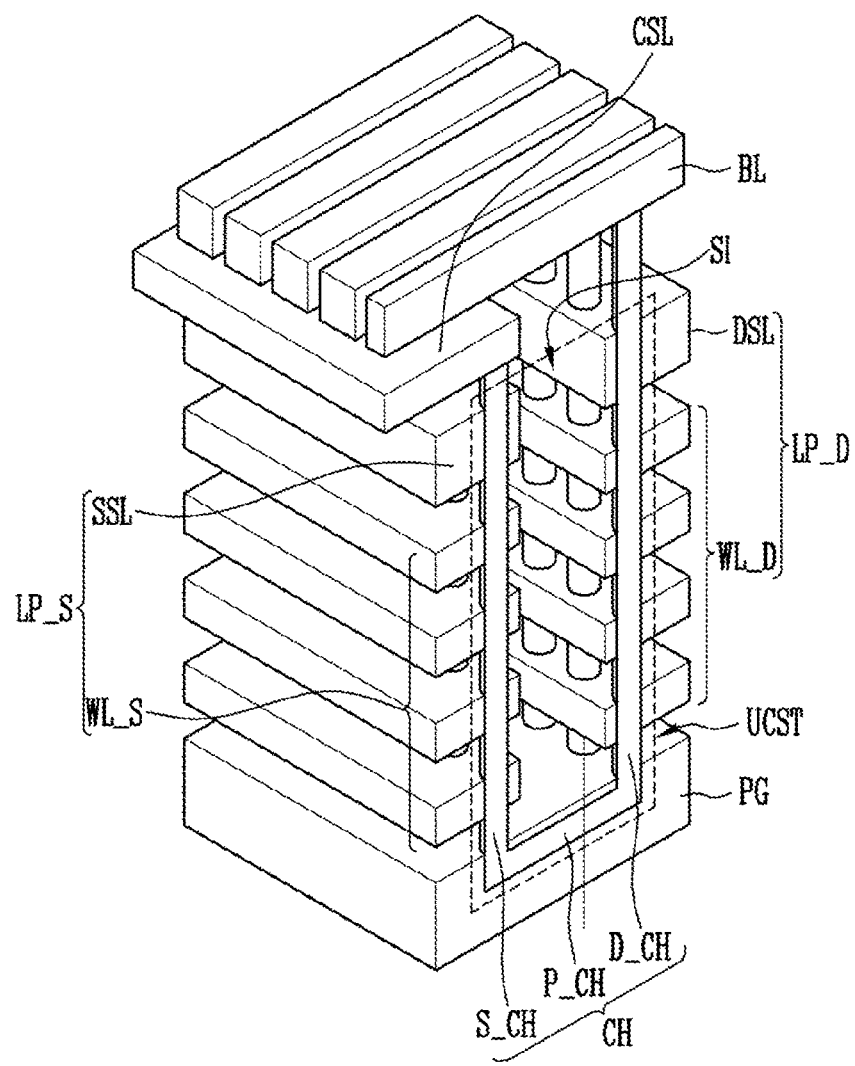

FIG. 2A and FIG. 2B are perspective views illustrating example structures of memory cell arrays according to an embodiment of the present disclosure. More specifically, FIG. 2A and FIG. 2B illustrate three dimensional memory cell arrays, respectively. In FIG. 2A and FIG. 2B, insulating layer and a multiple-layer structure including memory layers have been omitted for convenience of illustration.

Referring to FIG. 2A, each memory block of the memory cell array may include a straight type of a cell string SCST. The straight type cell string SCST may include a channel pillar CH, and may also include line patterns LP surrounding the channel pillar CH and being spaced from each other. The channel pillar CH may extend in one direction.

The channel pillar CH may be disposed between and electrically coupled to a source line SL and bit line BL. The channel pillar CH may fill a hole passing through the line patterns LP. The channel pillar CH may have a tube shape having a hollow region, which will be filled with an insulating layer. Alternatively, the channel pillar CH has a cylindrical shape having no hollow region.

Between the channel pillar CH and line patterns LP, a multiple-layer structure including a memory layer may be formed. The multiple-layer structure may be formed along an external surface of the channel pillar CH. Alternatively, the multiple-layer structure may be formed along an external surface of each of the line patterns LP. In the latter case, the multiple-layer structures may be separated from each other via first and second slits SI1 and SI2.

The bit line BL may be coupled to a top of the channel pillar CH, and may extend toward the page buffer 30 in FIG. 1. The source line SL may be directly connected to a bottom of the channel pillar CH. The source line SL may be a part of a semiconductor substrate doped with impurities. Alternatively, the source line SL may be a separate doped silicon layer formed on a semiconductor substrate.

The line patterns LP may be separated from each other by the first slit SI1. Each of the line patterns LP may include a lower select line LSL, word lines WL, and an upper select line USL, which are stacked on top of each other and arranged along the channel pillar CH. The lower select line LSL may be disposed between the word lines WL and source line SL. The lower select line LSL may be made of a single layer or multiple layers. The upper select line USL may be disposed between the word lines WL and bit line BL. The upper select line USL may be made of a single layer or multiple layers. One or more of the lower select line LSL and the upper select line USL may be divided into subdivisions. In an embodiment, the upper select line USL may be divided into subdivisions, each of which is smaller in size than that of the word line WL. For example, each of the word lines WL may surround at least two rows of channel pillars CH, whereas a single subdivision of the upper select line USL may surround a single row of channel pillars CH. In this way, as illustrated in FIG. 2A, the subdivisions of the upper select lines USL may be separated from each other not only by the first slit SI1 but also by the second slit SI2. Although FIG. 2A illustrates an example in which a single word line WL surrounds two rows of channel pillars CH, and a single subdivision of the upper select line USL surrounds a single row of channel pillars CH, the present disclosure is not limited thereto. Such a subdivision structure may also be applied to the lower select line LSL. The line patterns LP may extend toward the first row decoder 20A or second row decoder 20B as illustrated in FIG. 1. The line patterns LP each may be coupled, at one end thereof, to the pad pattern. The line patterns LP each may be electrically coupled via the pad pattern to the first row decoder 20A or second row decoder 30B.

In an embodiment, each of the memory cells may be formed at each of intersections of the channel pillar CH and word lines WL. A lower select transistor may be formed at an intersection of the channel pillar CH and lower select line LSL. The upper select transistor may be formed at an intersection of the channel pillar CH and upper select line USL. The lower select transistor, memory cells, and upper select transistor arranged along a single channel pillar CH may form a single straight type cell string SCST. The word lines WL may transmit signals to gates of the memory cells. The lower select line LSL may transmit signals to a gate of the lower select transistor. The upper select line USL may transmit signals to a gate of the upper select transistor.

Referring to FIG. 2B, each memory block of a memory cell array may include a U-shaped cell string UCST. The U-shaped cell string UCST may include a U-shaped structure including a channel pillar CH, line patterns LP_S and LP_D surrounding the channel pillar CH and being spaced from each other, and a pipe gate PG being disposed under the line patterns LP_S, LP_D and surrounding the channel pillar CH.

The channel pillar CH may include a pipe channel layer P_CH, which embedded in the pipe gate PG, a source side channel pillar S_CH, and a drain side channel pillar D_CH. The source side channel pillar S_CH and the drain side channel pillar D_CH may extend upwardly from both ends of the horizontal channel layer P_CH, respectively. The channel pillar CH may have a tube shape or a cylindrical shape as described above with reference to FIG. 2A. A multiple-layer structure including a memory layer may surround the channel pillar CH. The multiple-layer structure may be formed along an external surface of each of the channel pillars CH. Alternatively, the multiple-layer structure may be formed along an external surface each of the line patterns LP_S and LP_D. In the latter case, the multiple-layer structures may be separated from each other via a slit SI1.

The channel pillar CH may be disposed between and electrically coupled to a common source line CSL and a bit line BL. The bit line BL and common source line CSL may be disposed at different layers. For example, the common source line CSL may be disposed under the bit line BL. The bit line BL may be electrically coupled to a top of the drain side channel pillar D_CH, and may extend toward the page buffer 30 illustrated in FIG. 1. Between the bit line BL and drain side channel pillar D_CH, a contact plug may be formed. The common source line CSL may be electrically coupled to a top of the source side channel pillar S_CH. Between the common source line CSL and source side channel pillar S_CH, a further contact plug may be formed.

The pipe gate PG may be disposed under the bit line BL, common source line CSL, and line patterns LP_S, LP_D, and may surround the pipe channel layer P_CH.

The line patterns LP_S, LP_D may include, respectively, source side line patterns LP_S and drain side line patterns LP_D separated from each other by the slit SI. The source side line patterns LP_S and drain side line patterns LP_D may be disposed under the bit line BL and common source line CSL.

The source side line patterns LP_S may include source side word lines WL_S and a source select line SSL stacked along the source side channel pillar S_CH. The source side word lines WL_S may be disposed between the common source line CSL and pipe gate PG. The source select line SSL may be disposed between the common source line CSL and source side word lines WL_S. The source select line SSL disposed between the common source line CSL and source side word lines WL_S may be made of a single layer or multiple layers.

The drain side line patterns LP_D may include drain side word lines WL_D and a drain select line DSL stacked along the drain side channel pillar D_CH. The drain side word lines may be WL_D may be disposed between the bit-line BL and pipe gate PG. The drain select line DSL may be disposed between the bit-line BL and drain side word lines WL_D. The drain select line DSL disposed between the bit-line BL and drain side word lines WL_D may be made of a single layer or multiple layers.

The line patterns LP_S, LP_D may extend, respectively, toward the first row decoder 20A and second row decoder 20B in FIG. 1. For example, each of the source side line patterns LP_S may extend toward the first row decoder 20A. Each of the drain side line patterns LP_D may extend toward the second row decoder 20B. Each of the line patterns LP_S, LP_D may be coupled, at one end thereof, to the pad pattern. Each of the line patterns LP_S, LP_D may be electrically connected via the pad pattern to the first row decoder 20A and second row decoder 30B, respectively.

In an embodiment, each of source side memory cells may be formed at each intersection of the source side channel pillar S_CH and source side word lines WL_S. The drain side memory cells may be formed at intersections of the drain side channel pillar D_CH and drain side word lines WL_D. A source select transistor may be formed at an intersection of the source side channel pillar S_CH and source select line SSL. A drain select transistor may be formed at an intersection of the drain side channel pillar D_CH and drain select line DSL. The pipe transistor may be formed at an intersection of the pipe channel layer P_CH and pipe gate PG. The source select transistor, source side memory cells, pipe transistor, drain side memory cells, and drain select transistor arranged along the single channel pillar CH may form a single U-shaped cell string UCST. The source side word lines WL_S may transmit signals to gates of the source side memory cells gates. The drain side word lines WL_D may transmit signals to gates of the drain side memory cells. The source select line SSL may transmit signals to a gate of the source select transistor. The drain select line DSL may transmit signals to a gate of the drain select transistor. The pipe gate PG may transmit a signal to a gate of the pipe transistor.

In addition to example structures of the channel pillar CH described above with reference to FIG. 2A and FIG. 2B, a variety of structures for the channel pillar CH (e.g., W shaped channel pillar) may be possible.

As described above with reference to FIG. 2A and FIG. 2B, the line pattern LP, LP_S, or LP_D surrounding the channel pillar CH may extend toward the row decoder 20A or 20B as illustrated in FIG. 1. More specifically, the line pattern LP, LP_S, or LP_D may be electrically connected via the pad pattern to the row decoder 20A or 20B. Hereinafter, a conductive pattern including the pad pattern and line pattern in each level will be described more specifically.

Figure 3:
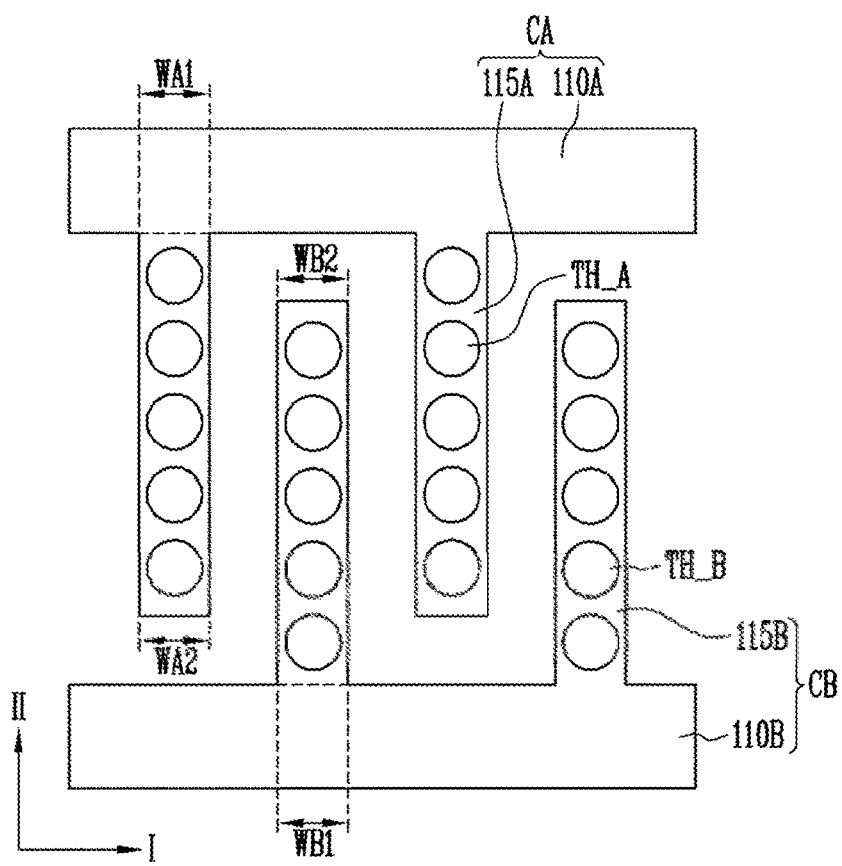
FIG. 3 is a plan view illustrating an example structure of a conductive pattern according to an embodiment of the present disclosure.

FIG. 3 is a plan view illustrating an example structure of a conductive pattern according to an embodiment of the present disclosure. FIG. 3 illustrates conductive patterns in a single plane defined by first and second directions I and II.

Referring to FIG. 3, a semiconductor device according to an embodiment of the present disclosure may include a first conductive pattern CA. The first conductive pattern CA may include a first pad pattern 110A extending in the first direction I, and first line patterns 115A extending from the first pad pattern 110A in the second direction II. The first and second directions I and II may cross each other. For example, the first and second directions I and II may cross perpendicularly.

The first pad pattern 110A may contact a contact plug (not illustrated). The contact plug may refer to a conductive structure to electrically connect the first pad pattern 110A to the row decoder. The plug may extend in a third direction normal to the plane defined by the first direction I and second direction II. The first line patterns 115A may receive signals via the first pad pattern 110A from the row decoder. Each of the first line patterns 115A may include a first end contacting the first pad pattern 110A and a second free end opposite to the first end. The first end may have a first width WA1 equal to a second width WA2 of the second end. In other words, each of the first line patterns 115A may have a constant width along the second direction II. Each of the first line patterns 115A may be passed through by first through-hole structures TH_A including the first channel pillars.

The semiconductor device according to an embodiment of the present disclosure may further include a second conductive pattern CB in the same plane or level as the first conductive pattern CA. The second conductive pattern CB may include a second pad pattern 110B extending in the first direction I, and second line patterns 115B extending from the second pad pattern 110B in the second direction II. The second pad pattern 110B may face the first pad pattern 110A, and the first line patterns 115A and second line patterns 115B may be arranged between the second pad pattern 110B and the first pad pattern 110A.

The second line patterns 115B may extend in the second direction II as mentioned above. The first and second directions I and II may cross each other. The second line patterns 115B may be disposed between the first pad pattern 110A and second pad pattern 110B. The second line patterns 115B and the first line patterns 115A may be arranged alternately in the first direction I.

The second pad pattern 110B may contact a contact plug (not illustrated). The contact plug may refer to a conductive structure to electrically connect the second pad pattern 110B to the row decoder. The plug may extend in a third direction normal to the plane defined by the first direction I and second direction II. The second line patterns 115B may receive signals via the second pad pattern 110B from the row decoder. Each of the second line patterns 115B may include a first end contacting the second pad pattern 110B and a second free end opposite to the first end. The first end may have a first width WB1 equal to a second width WB2 of the second end. In other words, each of the second line patterns 115B may have a constant width along the second direction II. Each of the second line patterns 115B may be passed through by second through-hole structures TH_A including the second channel pillars.

The first line patterns 115A and second line patterns 115B may correspond to the line patterns LP in FIG. 2A. In this case, each of the first through-hole structure TH_A and second through-hole structure TH_B may correspond to the straight type channel pillar CH in FIG. 2A. Alternatively, the first line patterns 115A and second line patterns 115B may correspond, respectively, to the source side line pattern LP_S, and the drain side line pattern LP_D in FIG. 2B. In this case, the first through-hole structure TH_A and second through-hole structure TH_B may correspond respectively to the source side channel pillar S_CH, and the drain side channel pillar D_CH in FIG. 2B.

The first pad pattern 110A may be electrically connected to the first row decoder 20A in FIG. 1. In an embodiment, the first pad pattern 110A may be adjacent to the first row decoder 20A illustrated in FIG. 1. The second pad pattern 110B may be electrically connected to the second row decoder 20B in FIG. 1. In an embodiment, the second pad pattern 110B may be adjacent to the second row decoder 20B illustrated in FIG. 1.

In an example embodiment illustrated in FIG. 3, a signal may be applied via a single first pad pattern 110A to a multiple of first line patterns 115A at the same time. Further, a signal may be applied via the single second pad pattern 110B to multiple second line patterns 115B at the same time. Each of the first and second line patterns 115A and 115B may have a uniform width along the second direction II.

Figure 4A:
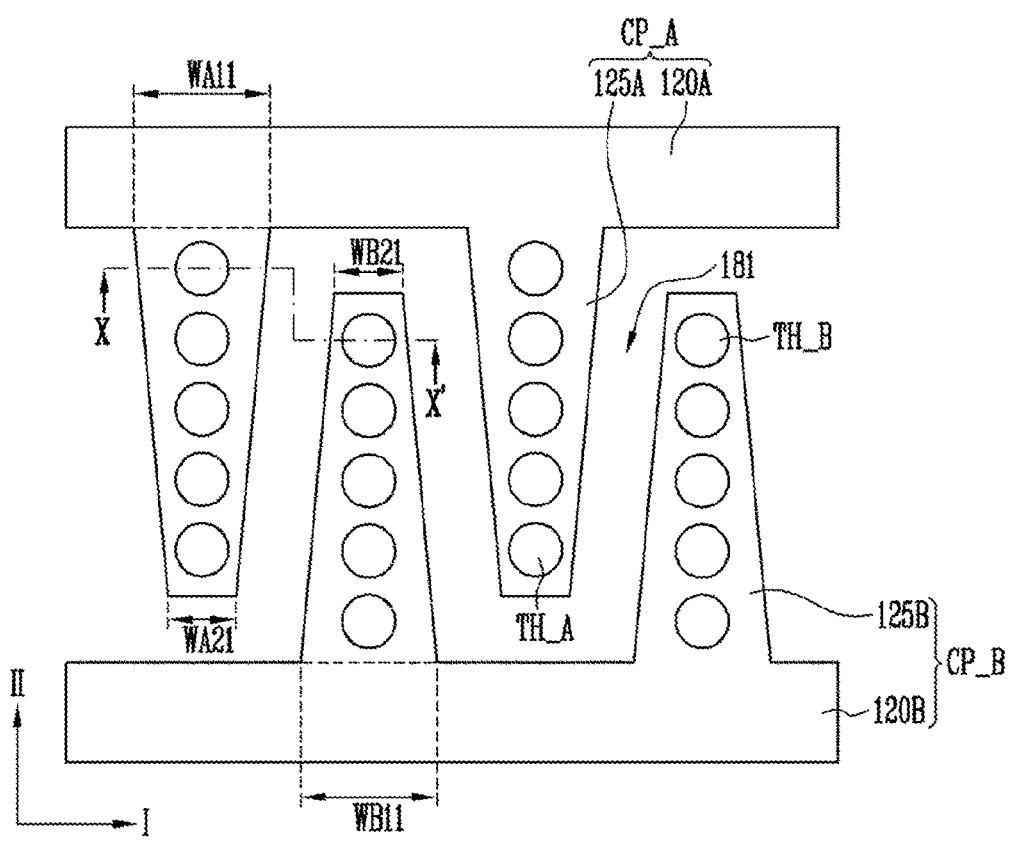
FIG. 4A to FIG. 4C are a plan view and cross-sectional views illustrating example structures of semiconductor devices according to embodiments of the present disclosure.
Figure 4B:
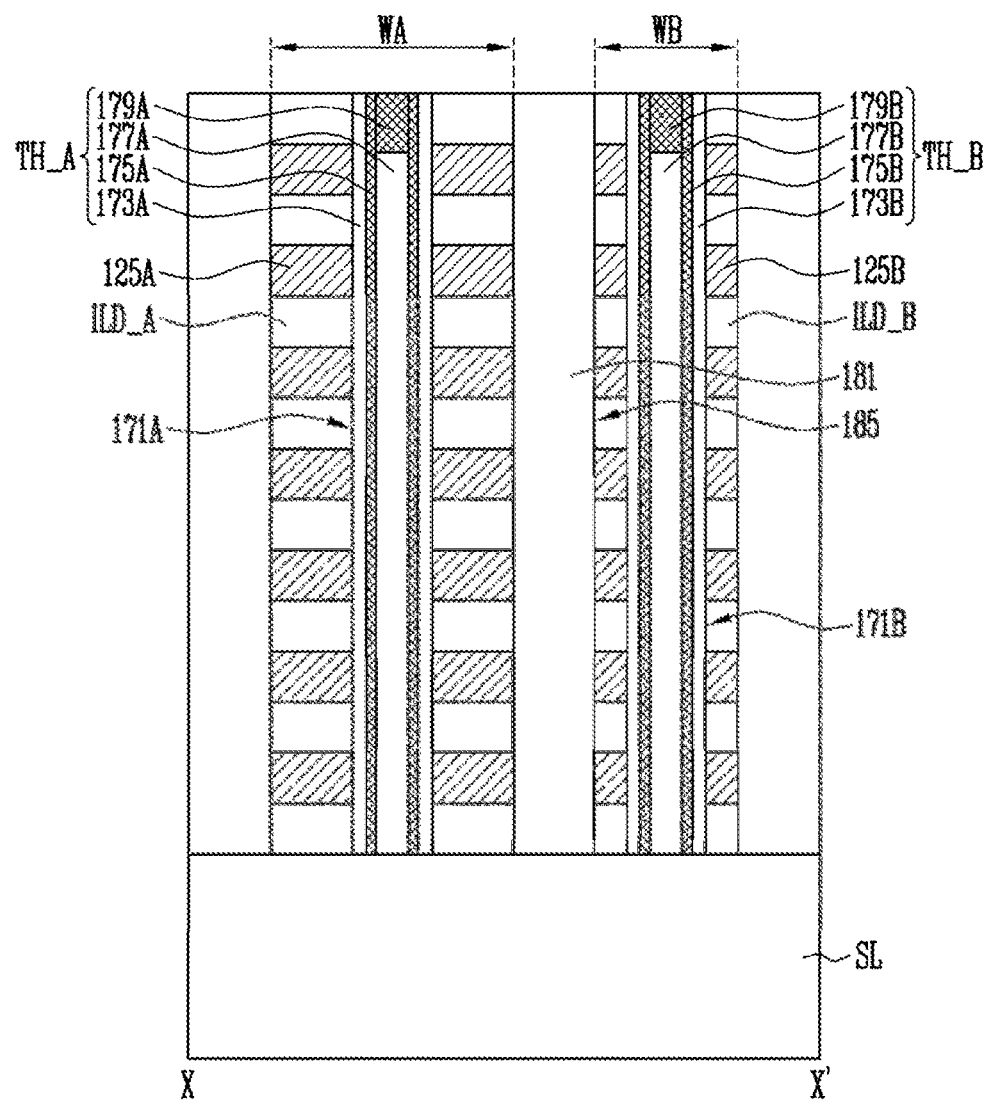
Figure 4C:
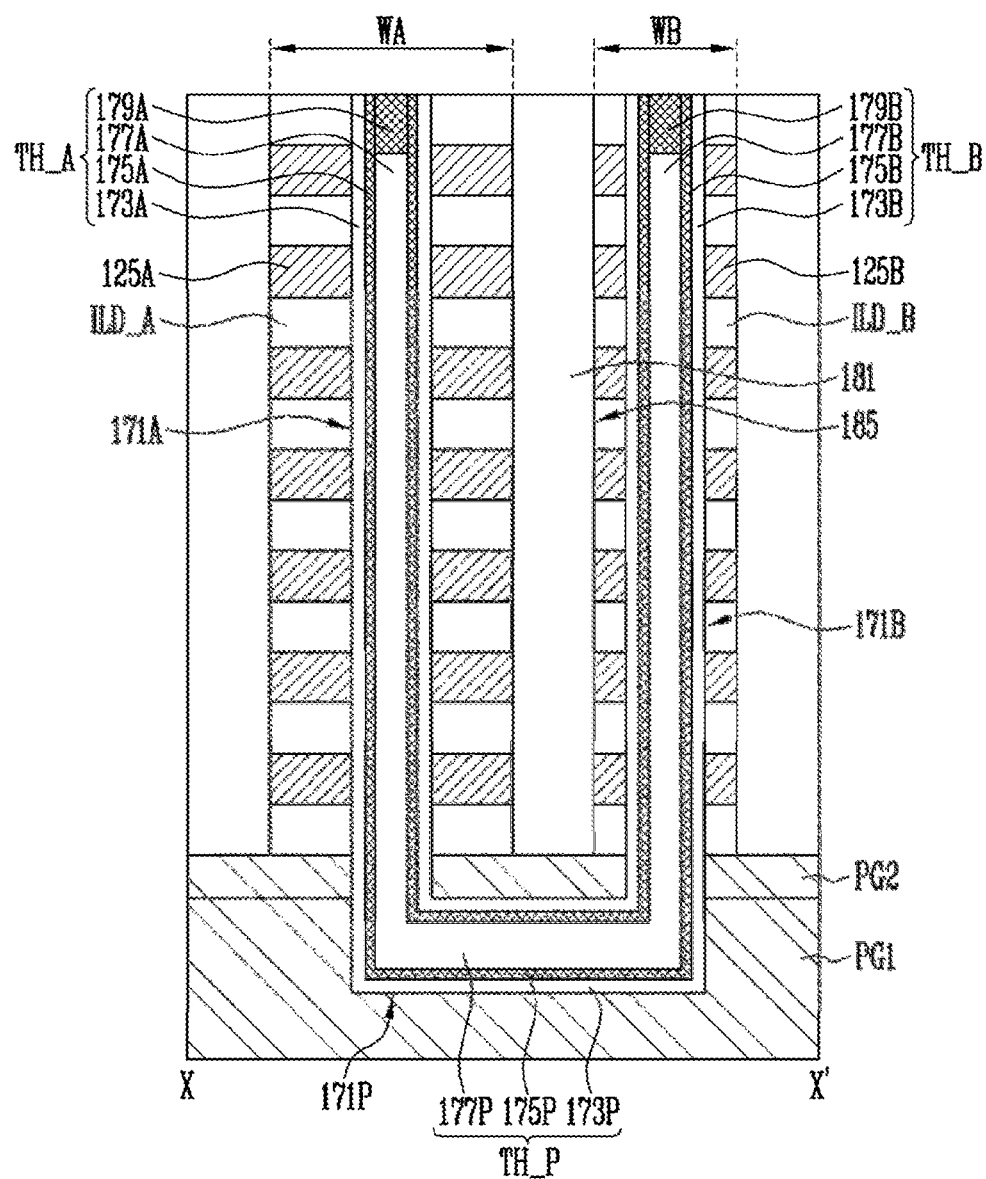

FIG. 4A to FIG. 4C are a plan view and cross-sectional views illustrating example structures of semiconductor devices according to embodiments of the present disclosure. More specifically, FIG. 4A illustrates conductive patterns of the semiconductor device in a single plane defined by first and second directions I and II. FIG. 4B and FIG. 4C illustrate cross-sectional views of the semiconductor device taken in a line "X-X'" in FIG. 4A.

Referring to FIG. 4A, the semiconductor device according to an embodiment of the present disclosure may include a first conductive pattern CP_A. The first conductive pattern CP_A may include a first pad pattern 120A extending in the first direction I, and first line patterns 125A extending from the first pad pattern 120A in the second direction II. The first and second directions I and II may cross each other.

The first pad pattern 120A may contact a contact plug (not illustrated). The contact plug may refer to a conductive structure to electrically connect the first pad pattern 120A to the row decoder. The plug may extend in a third direction normal to the plane defined by the first direction I and second direction II. The first line patterns 125A may receive signals via the first pad pattern 120A from the row decoder. Each of the first line patterns 125A may include a first end contacting the first pad pattern 120A and a second free end opposite to the first end. In an embodiment, each of the first line patterns 125A may have a tapered shape such that a first width WA11 of the first end is larger than a second width WA21 of the second end. Each of the first line patterns 125A may be passed through by first through-hole structures TH_A including the first channel pillars. In other words, each of the first line patterns 125A may surround the first through-hole structures TH_A. In an example embodiment, each of the first line patterns 125A may surround a single row of the first through-hole structures TH_A arranged in the second direction II.

The semiconductor device according to an embodiment of the present disclosure may further include a second conductive pattern CP_B in the same plane or level as the first conductive pattern CP_A. The second conductive pattern CP_B may include a second pad pattern 120B extending in the first direction I, and second line patterns 125B extending from the second pad pattern 120B in the second direction II. The second pad pattern 120B may face the first pad pattern 120A, and the first line patterns 125A and second line patterns 125B may be arranged between the second pad pattern 120B and the first pad pattern 120A.

The second line patterns 125B may extend in the second direction II as mentioned above. The first and second directions I and II may cross each other. The second line patterns 125B may be disposed between the first pad pattern 120A and second pad pattern 120B. The second line patterns 125B and the first pad pattern 120A may be arranged alternately in the first direction I.

The second pad pattern 120B may contact a contact plug (not illustrated). The contact plug may refer to a conductive structure to electrically connect the second pad pattern 120B to the row decoder. The plug may extend in a third direction normal to the plane defined by the first direction I and second direction II. The second line patterns 125B may receive signals via the second pad pattern 120B from the row decoder. Each of the second line patterns 125B may include a first end contacting the second pad pattern 120B and a second free end opposite to the first end. In an embodiment, each of the first line patterns 125B may have a tapered shape such that a first width WB11 of the first end is larger than a second width WB21 of the second end. Each of the second line patterns 125B may be passed through by second through-hole structures TH_B including the second channel pillars. In other words, each of the second line patterns 125B may surround the second through-hole structures TH_B. In an example embodiment, each of the second line patterns 125B may surround a single row of the second through-hole structures TH_B arranged in the second direction II.

In an embodiment, the width WA11 of each first end of the first line patterns 125A contacting the first pad pattern 120A may be larger than the width WB21 of each second end of the second line patterns 125B adjacent to the first pad pattern 120A. Further, the width WA21 of each second end of the first line patterns 125A adjacent to the second pad pattern 120B may be smaller than the width WB11 of each first end of the second line patterns 125B contacting the second pad pattern 120B.

The first pad pattern 120A may be electrically connected to the first row decoder 20A in FIG. 1. In an embodiment, the first pad pattern 120A may be adjacent to the first row decoder 20A illustrated in FIG. 1. The second pad pattern 120B may be adjacent to and be electrically connected to the second row decoder 20B in FIG. 1. In an embodiment, the second pad pattern 120B may be adjacent to the second row decoder 20B illustrated in FIG. 1

In an embodiment, each of the first line patterns 125A may extend in the second direction II, and may have a width being increasingly larger toward the first pad pattern 120A. The second line patterns 125B each may extend in the second direction II and may have a width being increasingly larger toward the second pad pattern 120B. In this way, each first end of the first line patterns 125A contacting the first pad pattern 120A and each first end of the second line patterns 125B contacting the second pad pattern 120B may have a lowered resistance. As a result, the lowered resistance of the first ends of the first and second line patterns 125A and 125B may reduce an RC delay and may enhance operating speed of the memory cells electrically coupled to the first and second line patterns 125A and 125B.

In an embodiment, the first conductive pattern CP_A and second conductive pattern CP_B may be separated from each other by a slit 181.

Referring to FIG. 4B and FIG. 4C, the first conductive patterns CP_A as illustrated in FIG. 4A may be vertically arranged in the third direction normal to the plane defined by the first and second direction, and may be spaced apart from one another. The first conductive patterns CP_A and the first interlayer insulating layers ILD_A may be arranged alternately in the third direction. Each of the first interlayer insulating layers ILD_A may be interposed between adjacent first conductive patterns CP_A to insulate the adjacent first conductive patterns CP_A from each other.

Referring to FIG. 4B and FIG. 4C, the second conductive patterns CP_B as shown in FIG. 4A may be vertically arranged in the third direction normal to the plane defined by the first and second direction, and may be spaced apart from one another. The second conductive patterns CP_B and the second interlayer insulating layers ILD_B may be arranged alternately in the third direction. Each of the second interlayer insulating layers ILD_B may be interposed between adjacent second conductive patterns CP_B to insulate the adjacent second conductive patterns CP_B from each other.

Each of the first line patterns 125A of the first conductive pattern CP_A may surround the straight type first through-hole structure TH_A. Each of the second line patterns 125B of the second conductive pattern CP_B may surround the straight type second through-hole structure TH_B. The first through-hole structure TH_A and second through-hole structure TH_B may extend in the third direction.

The first through-hole structure TH_A may be formed in a first through-hole 171A passing through each of the first line patterns 125A and the first interlayer insulating layer ILD_A. The second through-hole structure TH_B may be formed in a second through-hole 171B passing through each of the second line patterns 125B and the second interlayer insulating layer ILD_B.

The first through-hole structure TH_A may include a first multiple-layer structure 173A, a first channel pillar 175A, a first core insulating layer 177A, and a first capping conductive layer 179A. The first multiple-layer structure 173A may include a memory layer. The first multiple-layer structure 173A may further include a charge blocking layer surrounding the memory layer.

The first multiple-layer structure 173A may further include a tunnel insulating layer surrounding the first channel pillar 175A. The tunnel insulating layer may be interposed between the memory layer and first channel pillar 175A. The first multiple-layers structure 173A may be formed along an inner surface of the first through-hole 171A. The memory layer may be made of silicon nitride layer with a charge trapping capability. The charge blocking layer may be made of silicon oxide. The tunnel insulating layer may include the silicon oxide. The first channel pillar 175A may be formed to have a hollow portion. In other words, the first channel pillar 175A may be formed in a tube shape along the inner surface of the first through-hole 171A. The first channel pillar 175A may be formed along an inner surface of the first multiple-layer structure 173A. The first channel pillar 175A may act as a channel layer. The first channel pillar 175A may be formed of a semiconductor layer such as a silicon layer. When the first channel pillar 175A is formed in a tube shape, the hollow portion of the first channel pillar 175A may be filled with the first core insulating layer 177A and first capping conductive layer 179A, which are stacked on top of each other. The first core insulating layer 177A may have a smaller height than the first through-hole 171A. The first capping conductive layer 179A may be disposed over the first core insulating layer 177A. The first capping conductive layer 179A may be made of doped polysilicon. When the first channel pillar 175A is formed in a cylindrical shape that is not open in an inner region thereof, the first core insulating layer 177A and first capping conductive layer 179A may be omitted.

The second through-hole structure TH_B may have the same configuration as the first through-hole structure TH_B. To be specific, the second through-hole structure TH_A may include a second multiple-layers structure 173B, a second channel pillar 175B, a second core insulating layer 177B and second capping conductive layer 179B. The second multiple-layers structure 173B may include a memory layer. The second multiple-layers structure 173B may further include a charge blocking layer surrounding the memory layer. The second multiple-layers structure 173B may further include a tunnel insulating layer surrounding the second channel pillar 175B. The tunnel insulating layer may be interposed between the memory layer and second channel pillar 175B. The second multiple-layers structure 173B may be formed along an inner side wall of the second through-hole 171B. The memory layer may be made of a silicon nitride layer with a charge trapping capability. The charge blocking layer may be made of a silicon oxide layer. The tunnel insulating layer may include a silicon oxide layer. The second channel pillar 175B may be formed to have a hollow portion. In other words, the second channel pillar 175B may be formed in a tube shape conformal to the inner side wall of the second through-hole 171A. The second channel pillar 175B may be formed along an inner wall of the second multiple-layers structure 173A. The second channel pillar 175B may act as a channel layer. The second channel pillar 175B may be formed of a semiconductor layer such as a silicon layer. When the second channel pillar 175B is formed in a tube shape, the hollow portion of the second channel pillar 175B may be filled with a stack of the second core insulating layer 177B and second capping conductive layer 179B. The second core insulating layer 177B may have a smaller height than the second through-hole 171B. The second capping conductive layer 179B may be disposed over the second core insulating layer 177B. The second capping conductive layer 179B may be made of doped polysilicon. If the second channel pillar 175B is formed in a cylindrical shape that does not have an inner space, the second core insulating layer 177B and second capping conductive layer 179B may be omitted.

The first width WA of the first line patterns 125A surrounding the first through-hole structure TH_A, and the second width WB of the second line patterns 125B surrounding the second through-hole structure TH_B may vary in the length direction of the first line patterns 125A and second line patterns 125B, respectively. The first width WA may decrease as the distance from the first pad pattern 120A increases, and the second width WB may decrease as the distance from the second pad pattern 120B increases. The vertical arrangement of the first line patterns 125A and the vertical arrangement of the second line patterns 125B may be separated from each other by a slit insulating layer 185 filing the slit 181. The slit 181 and the silt insulating layer 185 may vertically extend between the vertical arrangement of the first interlayer insulating layers ILD_A and the vertical arrangement of the second interlayer insulating layers ILD_B.

The example structure illustrated in FIG. 4B may be applied to the straight type cell string illustrated in FIG. 2A. More specifically, in FIG. 4B, the vertical arrangement of the first line patterns 125A and the vertical arrangement of the second line patterns 125B may correspond to the line patterns LP as illustrated in FIG. 2A. The first channel pillar 175A vertically extending through the vertical arrangement of the first line patterns 125A, and the second channel pillar 175B vertically extending through the vertical arrangement of the second line patterns 125B may correspond to the straight type channel pillar CH as shown in FIG. 2A. In this case, the first and second channel pillars 175A and 175B may be coupled in common to the source line SL disposed under the vertical arrangement of the first line patterns 125A and the vertical arrangement of the second line patterns 125B.

The configuration illustrated in FIG. 4C may be applied to the U-shaped cell string illustrated in FIG. 2B. More specifically, in FIG. 4C, the vertical arrangement of the first line pattern 125A may correspond to the source side line patterns LP_S illustrated in FIG. 2B. The vertical arrangement of the second line pattern 125B may correspond to the drain side line patterns LP_D illustrated in FIG. 2B. The first channel pillar 175A vertically extending through the vertical arrangement of the first line patterns 125A may correspond to the source side channel pillar S_CH illustrated in FIG. 2B. The second channel pillar 175B vertically extending through the vertical arrangement of the second line patterns 125B may correspond to the drain side channel pillar D_CH illustrated in FIG. 2B. In this case, the semiconductor device may further include the pipe gate PG disposed under the vertical arrangement of the first line patterns 125A and the vertical arrangement of the second line patterns 125B. Furthermore, the semiconductor device may further include a pipe through-hole structure TH_P passing through the pipe gate PG to connect at least one pair of the first and second through-hole structures TH_A and TH_B.

The pipe gate PG may include the first and second pipe gates PG1 and PG2, which are stacked on top of each other. The pipe gate PG may be passed through vertically and horizontally by the pipe through-hole 171P.

The pipe through-hole 171P may include both vertical portions extending from the first through-hole 171A and second through-hole 171B, respectively, and passing vertically through the second pipe gate PG2. The pipe through-hole 171P may further include a horizontal portion connecting the vertical portions. The horizontal portion may extend horizontally through the first pipe gate PG1. The pipe through-hole 171P may be filled with the pipe through-hole structure TH_P.

The pipe through-hole structure TH_P may include a third multiple-layer structure 173P, a pipe channel layer 175P, and a third core insulating layer 177P. The third multiple-layer structure 173P may connect the first and second multiple-layer structures 173A and 173B to each other. The third multiple-layer structure 173P may be formed along an inner surface of the pipe through-hole 171P. The first to third multiple-layer structures 173A, 173B, and 173P may be embodied as a monolithic liner layer. The pipe channel layer 175P may connect at least one pair of the first and second channel pillars 175A and 175B. The pipe channel layer 175P may be formed along an inner face of the third multiple-layer structure 173P. The pipe channel layer 175P and the first and second channel pillars 175A and 175B coupled thereto may be embodied as a monolithic liner layer. The third core insulating layer 177P may connect the first and second core insulating layers 177A and 177B with each other. The third core insulating layer 177P may fill an inner open region of the pipe channel layer 175P. The first to third core insulating layers 177A, 177B, and 177P may be embodied as a monolithic pattern.

Figure 5:
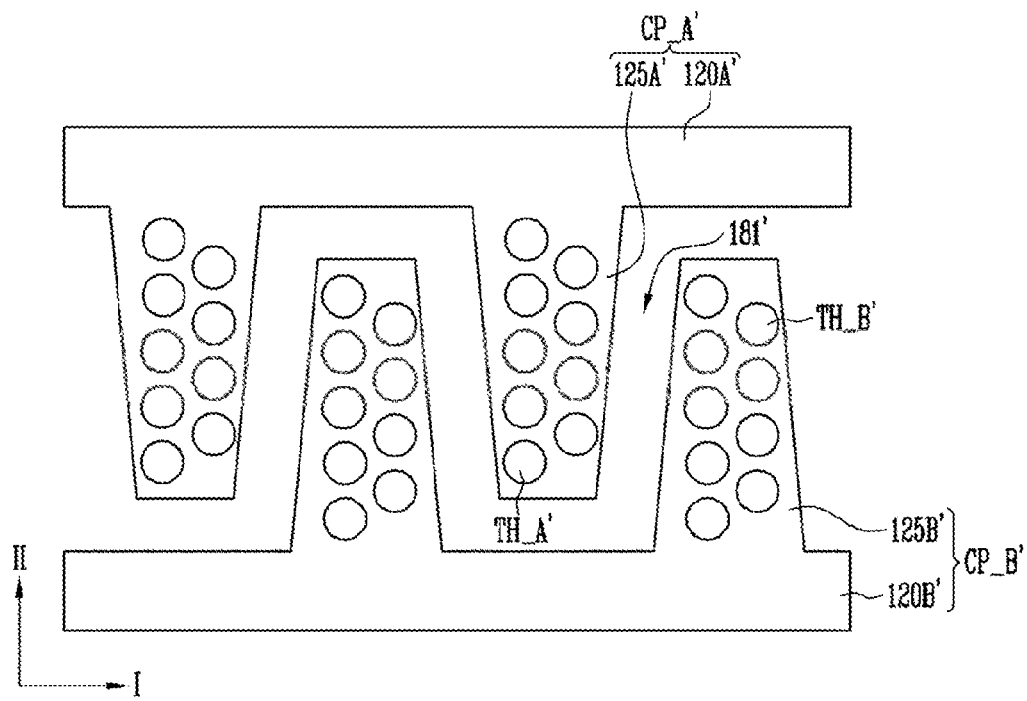
FIG. 5 and FIG. 6 are plan views illustrating example layouts of channel pillars passing through a line pattern according to embodiments of the present disclosure.
Figure 6:
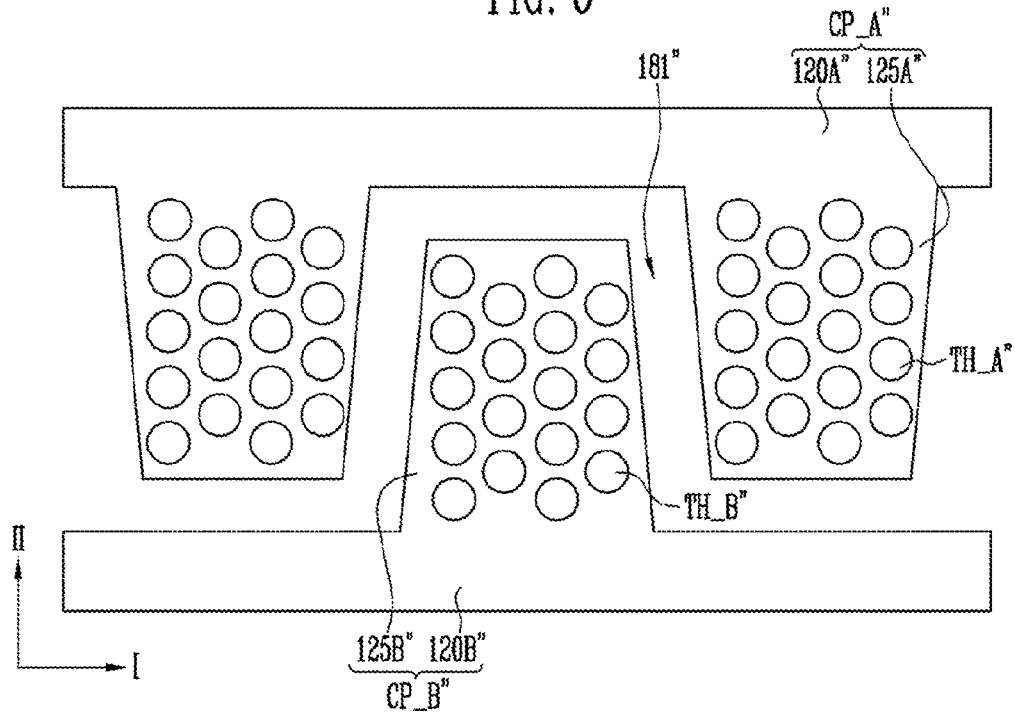

FIG. 5 and FIG. 6 are plan views illustrating example layouts of channel pillars passing through a line pattern according to embodiments of the present disclosure.

Referring to FIG. 5 and FIG. 6, the semiconductor device according to embodiments of the present disclosure may include a first conductive pattern CP_A' or CP_A" and second conductive pattern CP_B' or CP_B." The first conductive pattern CP_A' or CP_A" and second conductive pattern CP_B' or CP_B" may be separated from each other by the slit 181' or 181" similarly to the example illustrated in FIG. 4A.

The first conductive pattern CP_A' or CP_A" may include a first pad pattern 120A' or 120A" and first line patterns 125A' or 125A" extending from the first pad pattern 120A' or 120A", respectively, like the example illustrated in FIG. 4A. The second conductive pattern CP_B' or CP_B" may include a second pad pattern 120B' or 120B" and second line patterns 125B' or 125B" extending from the first pad pattern 120B' or 120B", respectively, like the example illustrated in FIG. 4A. In order to reduce the RC delay and enhance the operating speed of the memory cells coupled to the first line patterns 125A' or 125A" and second line patterns 125B' or 125B", a width of each of the first line patterns 125A' or 125A" may be increasingly larger toward the first pad pattern 120A' or 120A". Further, a width of each of the second line patterns 125B' or 125B" may be increasingly larger toward the second pad pattern 120B' or 120B".

Each of the first line patterns 125A' or 125A" may be passed through by first through-hole structures TH_A' or TH_A". Each of the second line patterns 125B' or 125B" may be passed through by second through-hole structures TH_B' or TH_B".

As illustrated in FIG. 5, each of the first line patterns 125A' may surround two rows of the first through-hole structures TH_A'. Each of the second line patterns 125B' may surround two rows of the second through-hole structures TH_B'. Alternatively, as illustrated in FIG. 6, each of the first line patterns 125K may surround at least two rows, for example, four rows of the first through-hole structures TH_A". Each of the second line patterns 125B" may surround at least two rows, for example, four rows of the second through-hole structures TH_B".

Each of the first through-hole structures TH_A' or TH_A" as illustrated in FIG. 5 and FIG. 6 may correspond to the first channel pillar as illustrated in FIG. 4B and FIG. 4C. Each of the second through-hole structures TH_B' or TH_B" as illustrated in FIG. 5 and FIG. 6 may correspond to the second channel pillar illustrated in FIG. 4B and FIG. 4C. The first through-hole structures TH_A' or TH_A" and second through-hole structures TH_B' or TH_B" may be arranged in a staggered form for a high integration density.

Figure 7:
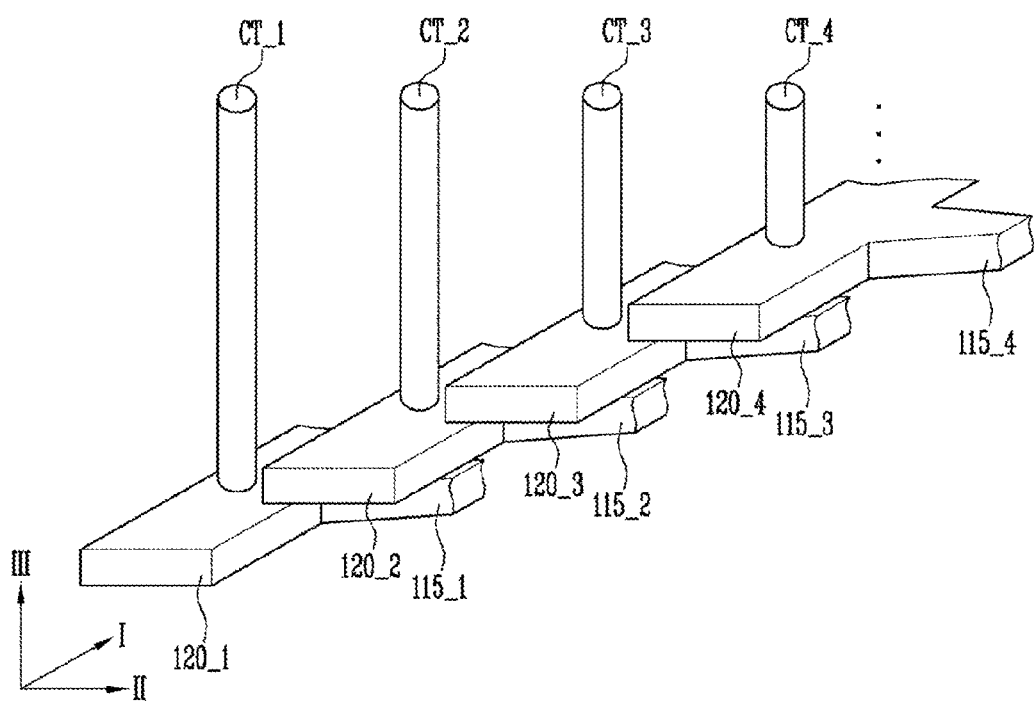
FIG. 7 is a diagram illustrating an example stack configuration of a pad pattern according to an embodiment of the present disclosure.

FIG. 7 is a diagram illustrating an example stack configuration of a pad pattern according to an embodiment of the present disclosure. A vertical arrangement of pad patterns illustrated in FIG. 7 may be a vertical arrangement of the first pad pattern or a vertical arrangement of the second pad patterns as mentioned above.

Referring to FIG. 7, pad patterns 120_1 to 120_4 according to an embodiment of the present disclosure may be stacked in a step-shaped structure.

Each of the pad patterns 120_1 to 120_4 may be coupled to each of line patterns 115_1 to 115_4 disposed in the same plane or level. Each pad pattern 120_1 to 120_4 may transmit a signal from the row decoder to each line pattern 115_1 to 115_4 disposed in the same plane or level.

The pad patterns 120_1 to 120_4 each may extend in a first direction I. The line patterns 115_1 to 115_4 each may extend in a second direction II perpendicular to the first direction I. The pad patterns 120_1 to 120_4 may be stacked in a step-shaped structure in a third direction III normal to a plane defined by the first and second direction I and II. Each of contact plugs CT_1 to CT_4 may be disposed over each of the pad patterns 120_1 to 120_4, and may extend in the third direction III. Each of the pad patterns 120_1 to 120_4 may be electrically coupled via each of the contact plugs CT_1 to CT_4 to the row decoder.

FIG. 8A to FIG. 8D are cross-sectional views for explaining an example method of manufacturing a semiconductor device according to an embodiment of the present disclosure.

Figure 8A:
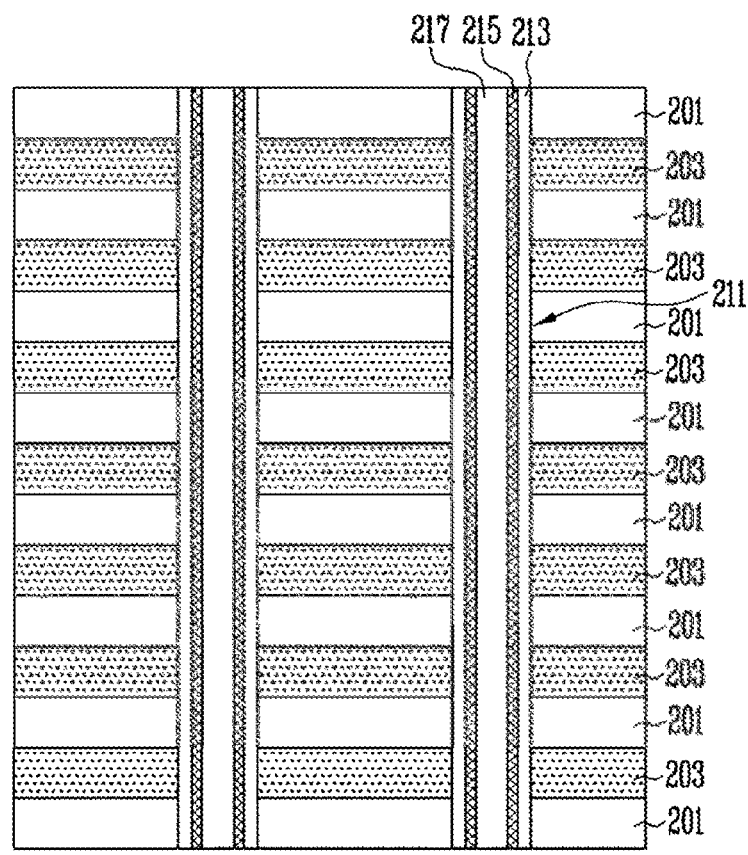
FIG. 8A to FIG. 8D are cross-sectional views for explaining an example method of manufacturing a semiconductor device according to an embodiment of the present disclosure.

Referring to FIG. 8A, first material layers 201 and second material layers 203 may be alternately stacked on top of each other. Although not illustrated in the figure, first material layers 201 and second material layers 203 may be formed over a source line, or over a pipe gate being passed through by a pipe through-hole filled with a sacrificial material.

The second material layers 203 may respectively define conductive patterns regions. The first material layers 201 may respectively define interlayer insulating layers regions. The second material layers 203 may be made of a different material from the first material layers 201.

For example, the first material layers 201 may be made of an insulating material for an interlayer insulating layer. The second material layers 203 may be made of a conductive material for a conductive pattern.

Alternatively, the first material layers 201 may be made of an insulating material for an interlayer insulating layer. The second material layers 203 may be made of a sacrificial insulating material having a different etching rate from the first material layers 201. In an embodiment, each of the first material layers 201 may be made of a silicon oxide layer, and each of the second material layers 203 may be made of a silicon nitride layer. In this way, the first and second material layers 201 and 203 made of the insulating materials may lower the difficulty level of the etching processes for the through-holes 211 and slits.

Alternatively, the second material layers 203 may be made of a conductive material for a conductive pattern, and the first material layers 201 may be made of a sacrificial conductive material having a different etching rate from the second material layers 203. In an embodiment, each of the first material layers 201 may be made of an undoped silicon layer, and each of the second material layers 203 may be made of a doped silicon layer.

Thereafter, the first material layers 201 and second material layers 203 may be partially etched away to form through-holes 211 extending through the first material layers 201 and second material layers 203. The through-holes 211 may expose a source line (not illustrated), or expose the sacrificial material (not illustrated) in the pipe through-hole. When the sacrificial material in the pipe through-hole is exposed, the sacrificial material may be removed through the through-holes 211 to open the pipe through-hole.

Subsequently, although not illustrated in the figure, in order to define steps for pad patterns, the first material layers 201 and second material layers 203 may be etched in a step-shaped structure.

Subsequently, a multiple-layers structure 213 including a memory layer may be formed along each of sidewalls of the through-holes 211. The multiple-layers structure 213 may include an arrangement of a charge blocking layer, a memory layer, and a tunnel insulating layer. The charge blocking layer, memory layer and tunnel insulating layer each may be embodied as a liner layer formed along each side-wall of the through-holes 211. After the formation of the multiple-layer structure 213, a channel layer 215 may be formed. The channel layer 215 may be made of a semiconductor material such as silicon. The channel layer 215 may have a cylindrical or tube shape. In the cylindrical shape, an inner region of the channel layer 215 may not be open, while, in the tube form, the inner region of the channel layer 215 may be open, that is, hollow. In the case of the tube shape of the channel layer 215, the hollow portion of the channel layer 215 may be filled with a core insulating layer 217.

When the pipe through-hole is opened, the multiple-layers structure 213, channel layer 215 and core insulating layer 217 may extend into the pipe through-hole. The multiple-layers structure 213, channel layer 215 and core insulating layer 217 may be planarized.

Figure 8B:
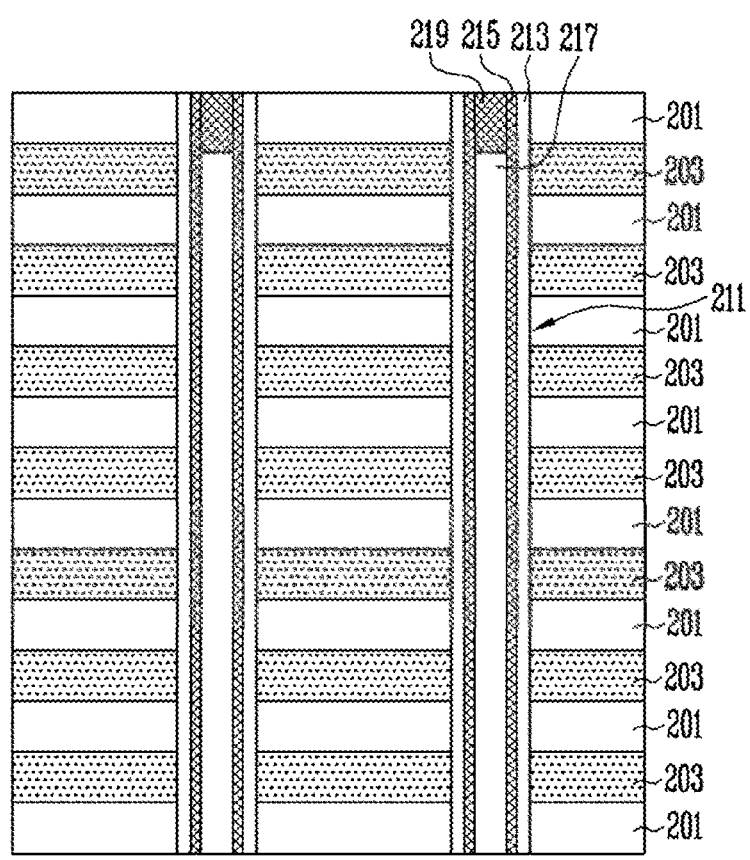

Referring to FIG. 8B, the core insulating layer 217 may be partially, vertically etched away to lower a height of the core insulating layer 217. Subsequently, a removed region of the core insulating layer 217 may be filled with a capping conductive layer 219. The capping conductive layer 219 may contact the tube-form channel layer 215. The capping conductive layer 219 may be made of a doped poly-silicon layer.

Figure 8C:
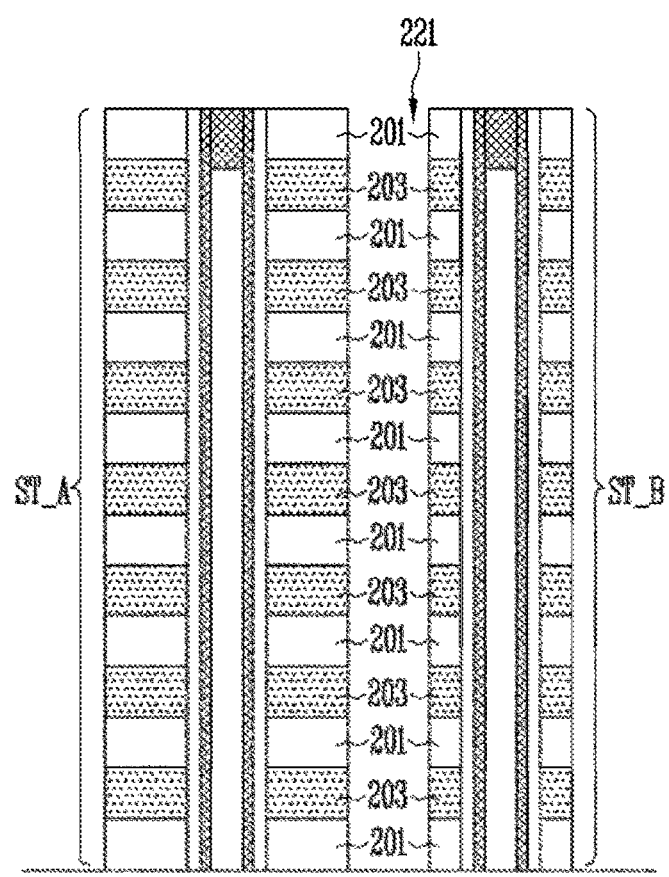

Referring to FIG. 8C, a slit 221 may be formed to vertically pass through the first and second material layers 201 and 203. This slit 221 may divide the stacked first and second material layers 201 and 203 into the first stack ST_A and second stack ST_B. The slit 221 may have the same layout as the slit illustrated in FIG. 4A, FIG. 5, and FIG. 6.

When the first material layers 201 is made of an insulating material for an interlayer insulating layer, and the second material layers 203 is made of a conductive material for a conductive pattern, the second material layers 203 of the first stack ST_A may serve as the first conductive patterns as described above in connection to FIG. 4A, FIG. 5, and FIG. 6, and the second material layers 203 of the second stack ST_B may serve as the second conductive patterns as described above in connection to FIG. 4A, FIG. 5, and FIG. 6. Further, the first material layers 201 each may be divided into the first interlayer insulating layer and second interlayer insulating layer by the slit 221.

Figure 8D:
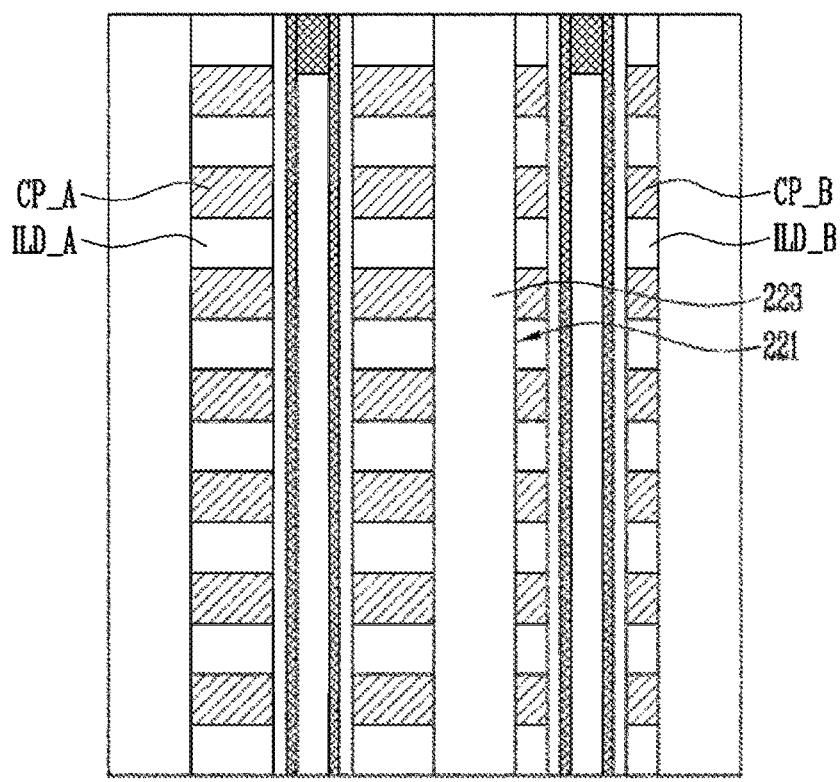

Referring to FIG. 8D, when each of the first material layers 201 is made of an insulating material for an interlayer insulating layer, and each of the second material layers 203 is made of a sacrificial insulating material, the second material layers 203 may be horizontally removed through the slit 221. Subsequently, each of the removed regions of the second material layers 203 may be filled with a conductive material to form first and second conductive patterns CP_A and CP_B. The first conductive patterns CP_A may be respectively formed in the removed regions of the second material layers 203 of the first stack ST_A, and the second conductive patterns CP_B may be respectively formed in the removed regions of the second material layers 203 of the second stack ST_B. Each of the first material layers 201 may be divided into a first interlayer insulating layer ILD_A and second interlayer insulating layer ILD_B by the slit 221.

Although not illustrated in the figure, when the first material layers 201 are made of a sacrificial conductive material, and the second material layers 203 are made of a conductive material for a conductive pattern, the first material layers 201 may be horizontally removed through the slit 221. Then, the removed regions of the first material layers 201 may be filled with an insulating material to form first and second interlayer insulating layers. The first interlayer insulating layers may be respectively formed in the removed regions of the first material layers 201 of the first stack ST_A. The second interlayer insulating layers may be respectively formed in the removed regions of the first material layers 201 of the second stack ST_B. The second material layers 203 each may be divided into first conductive patterns and second conductive patterns by the slit 221. For example, the second material layers 203 of the first stack ST_A may serve as the first conductive patterns as described above in connection to FIG. 4A, FIG. 5 and FIG. 6. The second material layers 203 of the second stack ST_B may serve as the second conductive patterns as described above in connection to FIG. 4A, FIG. 5 and FIG. 6.

Subsequently, the slit 221 may be filled with a slit insulating layer 223.

Figure 9:
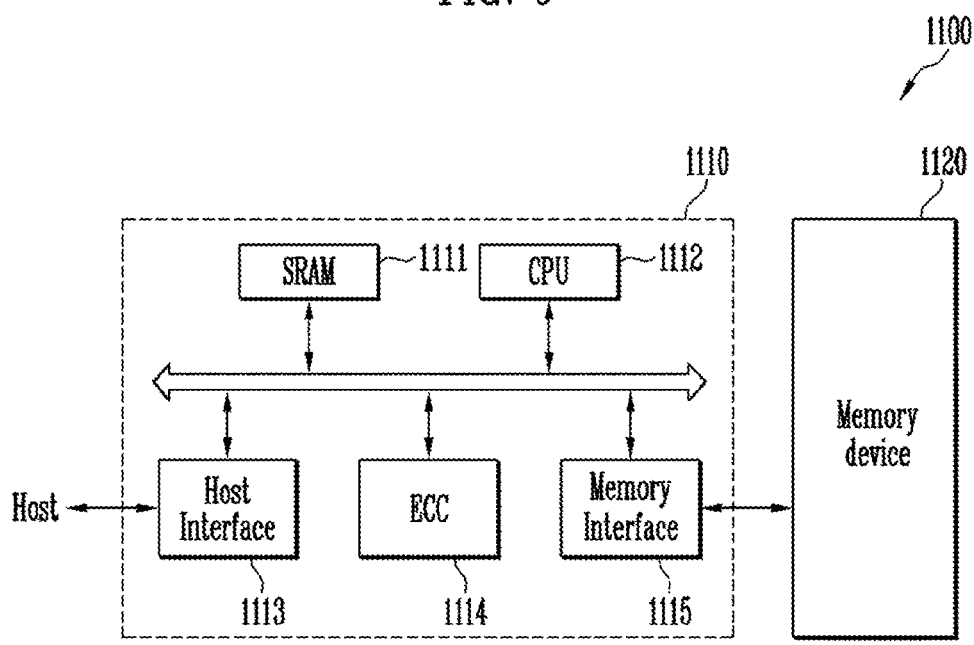
FIG. 9 is a diagram illustrating an example configuration of a memory system according to an embodiment of the present disclosure.

FIG. 9 is a diagram illustrating an example configuration of a memory system in accordance with the present disclosure.

Referring to FIG. 9, a memory system 1100 in accordance with an embodiment of the present disclosure may include a memory device 1120 and a memory device controller 1110.

The memory device 1120 may include a conductive pad pattern extending in a first direction and conductive line patterns extending from the pad pattern in a second direction crossing the first direction, each line pattern having a width being increasingly larger toward the pad pattern. Further, the memory device 1120 may be implemented in a multi-chips package including a plurality of flash memory chips.

The memory device controller 1110 may control the memory device 1120, and may include a SRAM 1111, CPU 1112, host interface 1113, ECC 1114, and memory interface 1115. The SRAM 1111 may be employed as a work memory for the CPU 1112. The processing unit 1112 may execute overall control operations of the controller 1110 to exchange data. The host interface 1113 may have a data exchange protocol of a host or a host system connected to the memory system 1100. The error correction block 1114 may detect and correct errors contained in data read from the memory device 1120. The memory interface 1115 may interface with the semiconductor memory device 1120 according to the present disclosure. It may be appreciated by the skilled person to the art that, as not illustrated in the figure, the controller 1110 of the memory system 1100 according to an embodiment of the present disclosure may be further provided with a ROM (not illustrated) to store code data to interface with the host system or host.

In the memory system 1100 as illustrated in FIG. 9, the semiconductor memory device 1120 and the controller 1110 may be combined to be implemented as a memory card or semiconductor disk device (e.g., Solid State Disk: SSD). In an embodiment, when the memory system 1100 is implemented in the SSD, the external devices (e.g., a host system) and the controller 1110 may be connected to each other via various interfaces. For instance, the interfaces may include standard interfaces such as Multimedia Card (MMC), Enhanced Small Device Interface (ESDI), Parallel Advanced Technology Attachment (PATA), Serial Advanced Technology Attachment (SATA), Small Computer Small Interface (SCSI), Serial Attached SCSI (SAS), Universal Serial Bus (USB), PCI express (PCIe), Integrated Device Electronics (IDE), and the like.

Figure 10:
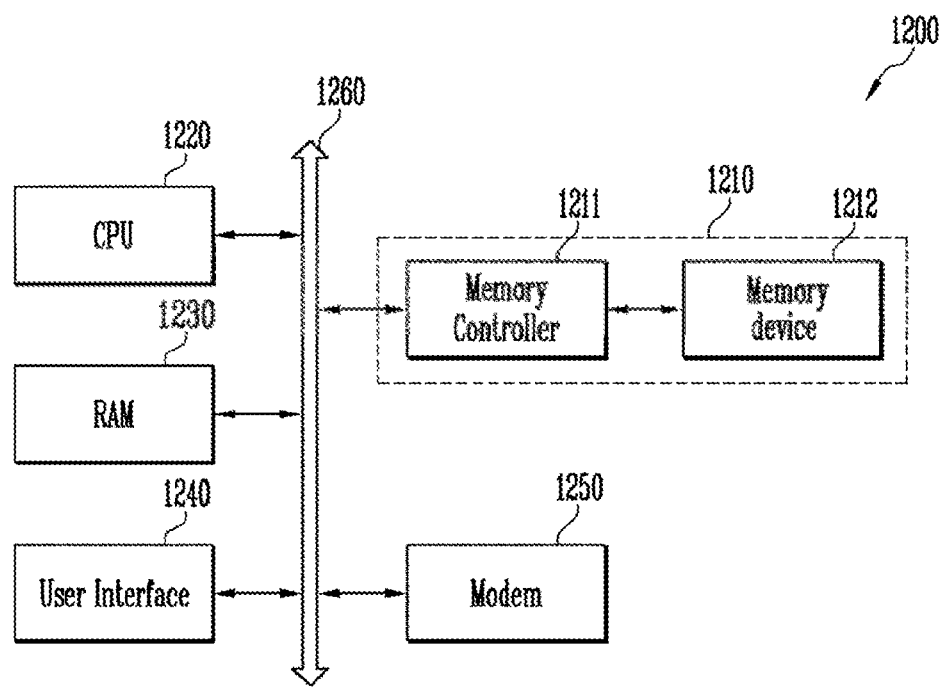
FIG. 10 is a diagram illustrating an example configuration of a computing system according to an embodiment of the present disclosure.

FIG. 10 is a diagram illustrating an example configuration of a computing system in accordance with an embodiment of the present disclosure.

Referring to FIG. 10, the computing system 1200 in accordance with an embodiment of the present disclosure may include a CPU 1220, RAM 1230, user interface 1240, modem 1250, and memory system 1210, all of which are electrically connected to each other via a system bus 1260. Further, when the computing system 1200 is implemented in a mobile device, the computing system 1200 may be further provided with a battery (not illustrated) to supply an operation voltage thereof, and may be further provided with an application chipset, a camera image processor (CIS), a mobile DRAM, etc.

The memory system 1210 may include the memory device 1212, and the memory device controller 1211 as illustrated in FIG. 9.

In the present disclosure, a width of a line pattern extending from a pad pattern is increasingly larger toward the pad pattern. As a result, the resistance of an end of the line pattern coupled to the pad pattern may be lowered. A signal from the pad pattern may be smoothly transmit to the line pattern, and an operating speed of the memory cells electrically coupled to the line pattern may be enhanced.

The above description is not to be taken in a limiting sense, but is made merely for the purpose of describing the general principles of exemplary embodiments, many additional embodiments of this invention are possible. It is understood that no limitation of the scope of the invention is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:

1. A semiconductor device comprising:
    a lower layer;
    first conductive patterns stacked over the lower layer, the first conductive patterns each including a first pad pattern extending in a first direction and first line patterns extending from the first pad pattern in a second direction crossing the first direction, a width of each of the first line patterns increasing as a distance from the first pad pattern decreases, wherein the width of each of the first line patterns is perpendicular to a direction in which the first conductive patterns are stacked;
    a contact plug being in contact with the first pad pattern, wherein the width of each of the first line patterns increases as a distance from the contact plug decreases; and
    first interlayer insulating layers,
    wherein the first conductive patterns and the first interlayer insulating layers are alternately stacked on top of each other.

2. The device of claim 1, further comprising first channel pillars passing through the first line patterns and the first interlayer insulating layers.

3. The device of claim 2, wherein each of the first line patterns surrounds a single row or multiple rows of the first channel pillars.

4. The device of claim 2, wherein the first channel pillars are arranged in a staggered form.

5. The device of claim 1, wherein the first pad patterns are stacked in a step-shaped structure.

6. The device of claim 1, further comprising second conductive patterns and second interlayer insulating layers alternately stacked on top of each other, wherein:
    each of the second conductive patterns includes a second pad pattern extending in the first direction and second line patterns extending from the second pad pattern in the second direction, a width of each second line pattern increasing as a distance from the second pad pattern decreases,
    the first and second conductive patterns are in the same planes;
    the first and second line patterns are disposed between the first and second pad patterns; and
    the first line patterns and the second line patterns are arranged alternately.

7. The device of claim 6, further comprising second channel pillars passing through the second line patterns and the second interlayer insulating layers.

8. The device of claim 7, wherein each of the second line patterns surrounds a single row or multiple rows of the second channel pillars.

9. The device of claim 7, wherein the second channel pillars are arranged in a staggered form.

10. The device of claim 6, wherein each end of the first line patterns adjacent to the first pad pattern has a lager width than each end of the second line patterns adjacent to the first pad pattern.

11. The device of claim 6, wherein each end of the first line patterns adjacent to the second pad pattern has a smaller width than each end of the second line patterns adjacent to the second pad pattern.

12. The device of claim 6, further comprising:
    first channel pillars passing through the first line patterns and the first interlayer insulating layers; and
    second channel pillars passing through the second line patterns and the second interlayer insulating layers.

13. The device of claim 12, further comprising a source line disposed under the first and second conductive patterns, the source line being coupled in common to the first channel pillars and the second channel pillars.

14. The device of claim 12, further comprising:
    a pipe gate disposed under the first and second conductive patterns; and
    a pipe channel layer embedded in the pipe gate, the pipe channel layer connecting at least one pair of the first channel pillar and the second channel pillar.

15. The device of claim 6, wherein the second pad patterns are stacked in a step-shaped structure.

16. A semiconductor device comprising:
    a first pad pattern extending in a first direction;
    first line patterns extending from the first pad pattern in a second direction crossing the first direction, each first line pattern having a width being increasingly larger toward the first pad pattern, the first line patterns disposed above a lower layer in a third direction perpendicular to the first and second directions; and
    a contact plug being in contact with the first pad pattern, wherein the width of each of the first line patterns is perpendicular to the third direction and increases as a distance from the contact plug decreases.

17. The device of claim 16, further comprising:
    a second pad pattern extending in the first direction; and
    second line patterns extending from the second pad pattern in the second direction, each second line pattern having a width being increasingly larger toward the second pad pattern,
    wherein the first and second line patterns are disposed between the first and second pad pattern, and the first line patterns and the second line patterns are arranged alternately.

18. A semiconductor device comprising:
    a lower layer;
    a first pad pattern extending in a first direction;
    first line patterns over the lower layer, the first line patterns extending from the first pad pattern in a second direction crossing the first direction, each of the first line patterns having a first end connected to the first pad pattern and a second end opposite to the first end, each of the first line patterns having a tapered shape such that a width of the first end is larger than a width of the second end, wherein the first end and the second end are disposed at positions with a same distance from the lower layer; and a contact plug being in contact with the first pad pattern, wherein the width of each of the first line patterns increases as a distance from the contact plug decreases.

19. The device of claim 18, further comprising:

a second pad pattern extending in the first direction; and second line patterns extending from the second pad pattern in the second direction, each of the second line patterns having a third end connected to the second pad pattern and a fourth end opposite to the third end, each of the second line patterns having a tapered shape such that a width of the third end is larger than a width of the fourth end, wherein the first and second line patterns are disposed between the first and second pad patterns, and the first line patterns and the second line patterns are arranged alternately.

20. The device of claim 17, further comprising:

a slit disposed between adjacent first and second line patterns to each other, wherein the slit extends in a diagonal direction to the first direction.

\* \* \* \* \*